(12) United States Patent
Yu et al.

(10) Patent No.: US 12,347,662 B2
(45) Date of Patent: Jul. 1, 2025

(54) DETERMINING AN OPTIMAL ION ENERGY FOR PLASMA PROCESSING OF A DIELECTRIC SUBSTRATE

(71) Applicant: PRODRIVE TECHNOLOGIES INNOVATION SERVICES B.V., Son en Breugel (NL)

(72) Inventors: Qihao Yu, Son (NL); Erik Lemmen, Son (NL); Bastiaan Joannes Daniel Vermulst, Son (NL)

(73) Assignee: PRODRIVE TECHNOLOGIES INNOVATION SERVICES B.V., Son en Breugel (NL)

(*) Notice: Subject to any disclaimer, the term of this patent is extended or adjusted under 35 U.S.C. 154(b) by 185 days.

(21) Appl. No.: 17/766,373

(22) PCT Filed: Oct. 1, 2020

(86) PCT No.: PCT/EP2020/077536
§ 371 (c)(1),
(2) Date: Apr. 4, 2022

(87) PCT Pub. No.: WO2021/064110
PCT Pub. Date: Apr. 8, 2021

(65) Prior Publication Data
US 2024/0105430 A1    Mar. 28, 2024

(30) Foreign Application Priority Data
Oct. 2, 2019 (NL) .................................. 2023935

(51) Int. Cl.
*H01J 37/32* (2006.01)
*C23C 16/515* (2006.01)
(Continued)

(52) U.S. Cl.
CPC ...... *H01J 37/32917* (2013.01); *C23C 16/515* (2013.01); *G01R 19/0046* (2013.01);
(Continued)

(58) Field of Classification Search
CPC .......................... C23C 16/515; G01R 19/0046
See application file for complete search history.

(56) References Cited

U.S. PATENT DOCUMENTS

| 11,699,572 B2* | 7/2023 | Dorf ................... H01J 37/3299 323/371 |
| 2010/0154994 A1* | 6/2010 | Fischer ............. H01J 37/32091 156/345.24 |

(Continued)

FOREIGN PATENT DOCUMENTS

| JP | H09129621 A | 5/1997 |
| JP | 2004193564 A | 7/2004 |

(Continued)

OTHER PUBLICATIONS

International Search Report and Written Opinion of the International Searching Authority from the European Patent Office, in PCT/EP2020/077536 dated Apr. 12, 2020, which is an international application corresponding to this U.S. application.

(Continued)

*Primary Examiner* — Binh X Tran
(74) *Attorney, Agent, or Firm* — Kolitch Romano Dascenzo Gates LLC

(57) ABSTRACT

An ion energy for plasma processing of a dielectric substrate is determined by exposing the dielectric substrate to a plasma discharge and applying a pulsed voltage waveform. This waveform includes a sequence of pulses, each having a higher voltage interval and a lower voltage interval having a voltage slope. First pulses of the sequence having differing voltage slopes are generated and applied to the dielectric (Continued)

substrate. For each first pulse, the voltage slope and a corresponding output current are determined. For each first pulse, at least one coefficient of a mathematical relation between the voltage slope and the corresponding output current based solely on the voltage slope and the output current determined for one or more of the first pulses is determined. A test function is applied and an optimal voltage slope value corresponding to the at least one coefficient making the test function true is selected.

10 Claims, 6 Drawing Sheets

(51) Int. Cl.
  *G01R 19/00* (2006.01)
  *H01L 21/02* (2006.01)
(52) U.S. Cl.
  CPC ........ *H01J 37/32146* (2013.01); *H01L 21/02* (2013.01); *H01J 2237/24564* (2013.01)

(56) References Cited

U.S. PATENT DOCUMENTS

| | | | | |
|---|---|---|---|---|
| 2014/0061156 | A1* | 3/2014 | Brouk | ............... H01J 37/32146 216/61 |
| 2017/0358431 | A1 | 12/2017 | Dorf et al. | |
| 2018/0032100 | A1 | 2/2018 | Kim et al. | |
| 2018/0166249 | A1* | 6/2018 | Dorf | ................. H01J 37/32706 |
| 2019/0180982 | A1* | 6/2019 | Brouk | ............... H01J 37/32009 |
| 2019/0393017 | A1* | 12/2019 | Kang | .................. H01L 29/7854 |
| 2021/0013006 | A1* | 1/2021 | Nguyen | ............ H01J 37/32128 |

FOREIGN PATENT DOCUMENTS

| | | |
|---|---|---|
| JP | 2009071133 A | 4/2009 |
| JP | 2010103465 A | 5/2010 |
| JP | 2012513124 A | 6/2012 |
| JP | 2015534212 A | 11/2015 |
| JP | 2015534718 A | 12/2015 |
| TW | 201312622 A | 3/2013 |

OTHER PUBLICATIONS

Kudlacek, P., et al.; "Accurate control of ion bombardment in remote plasmas using pulse-shaped biasing"; obtained from Journal of Applied Physics, American Institute of Physics, U.S., vol. 106, No. 7, Oct. 7, 2009.

Japan Patent Office, Office Action in Patent Application No. JP2022-520514 issued on Aug. 29, 2022, which is a foreign counterpart application corresponding to this U.S. Patent Application.

Taiwan Patent Office, Taiwan Search Report, dated Nov. 15, 2022 in Patent Application No. 109134066, which is a foreign counterpart application corresponding to this U.S. Application.

* cited by examiner

DETERMINING AN OPTIMAL ION ENERGY FOR PLASMA PROCESSING OF A DIELECTRIC SUBSTRATE

TECHNICAL FIELD

The present disclosure is related to methods and apparatuses for plasma processing of dielectric substrates, such as plasma-assisted etching and deposition. In particular, the present disclosure is related to methods of determining an optimal ion energy for plasma processing of dielectric substrates, and to corresponding apparatuses.

INTRODUCTION

Plasma-assisted etching and deposition, such as reactive ion etching (RIE), atomic layer etching (ALD) and atomic layer deposition (ALD), are widely used in semiconductor manufacturing. Taking the reactive ion etching for example, plasma is used not only to increase the rate of removing or growing materials, but also to increase the quality of the process. The plasma consists of positive ions, negative electrons and neutral particles. During etching process, the ions are accelerated by the negative voltage potential on the material surface and bombard the material, so that supply additional energy to the surface and accelerate the chemical reactions. Besides, the normal direction of ion bombardment to the material surface also enhances the anisotropy of the etching.

The ion energy is controlled within a limited range. Ions with too low energy result in a slow reaction rate while ions with too high energy causes sputtering, which decreases the selectivity. With the increasing demands on the smaller semiconductor size, accurate control of ion energy becomes critical in both plasma-enhanced deposition and etching. In general, a narrow ion energy distribution (IED) falling into a certain range of energy value is desired, which requires a constant negative voltage potential on the substrate material surface.

The ion energy is determined by the voltage potential of the substrate surface. For a conductive substrate material, a negative dc bias voltage can be directly connected to the table in the reactor. By varying the dc value of the voltage, the energy of the ions can be controlled correspondingly. However, for a dielectric substrate material, there is an equivalent substrate capacitance. A simple dc bias does not work well because the ions are charging the substrate during etching, resulting in an increase to the substrate voltage potential.

To control the ion energy with a dielectric substrate, a radio-frequency (RF) sinusoidal bias voltage is usually used in the conventional reactor. In this case, a blocking capacitor is required for RF biasing in order to generate a self-biased negative dc potential on the sheath. The sinusoidal voltage waveform produces a variant voltage potential on the substrate surface, thus resulting in a wide and bimodal IED. Although increasing the frequency helps narrowing the IED, it is limited by the ion mass and it is much less effective for light ions such as hydrogen. Furthermore, a sufficiently large biasing frequency makes the RF wavelength comparable to the substrate dimension, causing severe nonuniformities. Finally, the RF biasing generates a lot of reactive power, leading to a low efficiency and high cost.

The pulse-shape biasing is also used in plasma-enhanced etching and deposition. It consists of a wide negative pulse in the deposition and etching phase and a short positive pulse during the discharge phase.

The positive pulse is applied to the substrate potential in order to attract electrons and discharge the accumulated ions periodically. However, the substrate potential is still charged by the ions during etching or deposition phase, thereby a narrow IED cannot be obtained with this simple waveform. Like the RF biasing, although increasing the frequency is effective in narrowing the IED under certain circumstances, it degrades the process quality.

It is known from US 2014/0061156, 6 Mar. 2014 to apply a tailored pulsed-shape bias so as to compensate the ion accumulation effect on the dielectric substrate during etching or deposition phase. The bias voltage waveform consists of a decreasing negative voltage slope to compensate the substrate potential rise during deposition and etching phase, and a positive voltage pulse to attract electrons to keep charge balance during discharge phase. Such a voltage waveform can produce a narrow ion energy distribution. The repetition frequency is much less than the traditional RF biasing and pulse-shape biasing.

The negative voltage slope in US 2014/0061156 can be obtained by incorporating an ion current compensation, such as a current source, to a switch-mode power supply coupled to the substrate. The negative voltage slope of the pulsed voltage waveform must be finely tuned in order to obtain the narrowest IED. US 2014/0061156 proposes to evaluate a function based on the voltage slope, the effective capacitance of the substrate and the ion current compensation, and to adjust the ion current compensation until the function is true which would correspond to the narrowest IED. The function is made to be true when the ion current compensation equals the ion current. To determine the ion current compensation that equals the ion current, in one embodiment, a first ion current compensation is applied for a first cycle and a first voltage slope of the pulsed voltage waveform is measured. A second ion current compensation for a second cycle is applied and a second voltage slope is measured. From this, a third ion current compensation can be determined at which the function is expected to be true and therefore would result in a narrow IED.

One drawback however of the above method, is that a very simplified equivalent electrical model is used to synthesize the function, in which some stray capacitances, such as the table capacitance, are neglected. Furthermore, the effective capacitance of the substrate must be determined in order to be able to evaluate the function, requiring additional measurement. Measuring this capacitance in real time is very difficult to perform. On the other hand, measuring the capacitance once and assuming it to be constant may lead to erroneous results as the effective capacitance might be variant and dependent on parasitic capacitances introduced by the table, other components in the plasma chamber, the voltage potential on the substrate, and the plasma sheath.

The plasma sheath (also simply referred to as sheath) is a layer in a plasma near the substrate surface and possibly the walls of the plasma processing chamber with a high density of positive ions and thus an overall excess of positive charge. The surface with which the sheath is in contact with typically has a preponderance of negative charge. The sheath arises by virtue of the faster velocity of electrons than positive ions thus causing a greater proportion of electrons to reach the substrate surface or walls, thus decreasing the density of electrons in the sheath.

As a result, the capacitances and ion currents are different under different etching or deposition conditions. In addition, the sheath capacitance is also voltage dependent. A slight difference of the plasma condition or a change to the etching reactor might require a recalculation. These non-ideal factors bring on an inaccuracy in practice.

SUMMARY

It is an aim of the present disclosure to overcome the above drawbacks. It is an aim to find optimal operating conditions in plasma processing of dielectric substrates efficiently and in an automated way, without requiring manual intervention. It is also an aim to find optimal operating conditions in plasma processing of dielectric substrates more accurately, without relying on overly simplified equivalent electrical models.

According to a first aspect of the present disclosure, there is provided a method of determining an ion energy for plasma processing of a dielectric substrate, as set out in the appended claims.

Methods according to the present disclosure comprise exposing the dielectric substrate to a plasma discharge and applying a pulsed voltage waveform generated by a power supply to the dielectric substrate, particularly during the exposure. The pulsed voltage waveform comprises a sequence of pulses, each pulse comprising a higher, e.g. positive, voltage interval and a lower, e.g. negative, voltage interval, wherein the lower voltage interval comprises a voltage slope, in particular a negative voltage slope.

According to the present disclosure, the sequence comprises first pulses having differing voltage slopes between one another. The first pulses are applied to the dielectric substrate, in particular during exposure to the plasma discharge. For each one of the first pulses, the voltage slope and an output current corresponding to the voltage slope at an output of the power supply are determined. Either one or both of the voltage slope and corresponding output current can be measured, and the other one can be set by a control unit coupled to the power supply.

For each one of the first pulses, at least one coefficient of a mathematical relation between the voltage slope and the corresponding output current is determined based solely on the voltage slope and the output current determined for one or more of the first pulses. The mathematical relation is a function expressing a relation between the voltage slope and the output current. Either one of the voltage slope and the output current can be a variable of the function, and evaluating the function for the variable yields the other one of the voltage slope and output current. The function comprises at least one coefficient, which can be variable with the voltage slope and/or the output current. According to the present disclosure, the mathematical relation (function) is resolved for the at least one coefficient, such that the at least one coefficient is determined based on known (determined) values of voltage slope and output current.

Advantageously, a test function can be applied to the at least one coefficient in order to determine an optimal voltage slope. The test function is true when the at least one coefficient relates to an optimal voltage slope making the IED narrowest. The test function advantageously finds an extremum of the at least one coefficient.

Since the method relies only on voltage and current values, which can be determined automatically, methods of the present disclosure allow to tune the operational parameters of the plasma processing apparatus in a fully automated way, without manual intervention, and without requiring time consuming or cumbersome measurements of other electrical quantities, such as capacitance, which reduces cost and throughput time. Additionally, the automated tuning according to the present disclosure allows to auto-tune every dielectric substrate that is processed, leading to higher accuracy. Typically, a sequence of between 10 and 50 first pulses would suffice in order to find an optimal voltage slope with satisfactory accuracy.

Furthermore, the at least one coefficient is advantageously related to the system capacitances. By evaluating the coefficient(s) based on the voltage and current values only, the voltage-dependent and/or current-dependent behavior of the system capacitances are implicitly taken into account and there is no need to measure them separately. Methods according to the present disclosure therefore can provide a more accurate tuning to a desired (e.g., narrowest) IED.

Advantageously, the mathematical relation is a polynomial function between the output current and the voltage slope. The polynomial function can be of any degree, e.g. zero, one, two, three, etc., depending on the equivalent electrical model of the plasma processing system. By way of example, the polynomial function is a first degree polynomial, in particular of the kind: IP=k S+b, wherein IP represents output current, S represents voltage slope and wherein the at least one coefficient is at least one of k and b.

The first pulses can form a sequence having monotonically increasing voltage slopes. By way of example, the method may start with very small, e.g. zero, voltage slope, and systematically increasing the (negative) voltage slope until an extremum (e.g. maximum value) of the at least one coefficient is found. The voltage slope steps between consecutive pulses can be constant, or variable, and the method may provide to automatically adapt the voltage slope step between the first pulses, e.g. based on a behavior of the at least one coefficient that is determined. It will be convenient to note that any other suitable convergence algorithm can be used for selecting the voltage slopes in order to converge to an extremum of the at least one coefficient.

According to a second aspect of the present disclosure, there is provided an apparatus for plasma processing of a dielectric substrate, as set out in the appended claims.

An apparatus according to the present disclosure comprises means for generating a plasma, e.g. a plasma reactor coupled to an external power supply through a matching network, a processing platform for supporting the dielectric substrate and configured for exposure to the plasma, a power supply (power amplifier), a voltage measurement device and a current measurement device. The plasma is excited and sustained by the external power supply. The power amplifier is coupled to the processing platform and to a control unit. The power amplifier is configured to output a configurable tailored pulse-shape voltage waveform.

Advantageously, the apparatus is configured to carry out any of the methods according to the present disclosure. Methods of the present disclosure can be implemented in the control unit.

Methods and apparatuses as described herein can also be used to calculate and dimension electrical parameters which are hard to measure directly in practice, including the substrate capacitance, the table capacitance and the ion current.

BRIEF DESCRIPTION OF THE DRAWINGS

Aspects of the present disclosure will now be described in more detail with reference to the appended drawings, wherein same reference numerals illustrate same features and wherein.

DETAILED DESCRIPTION

Figure 1:
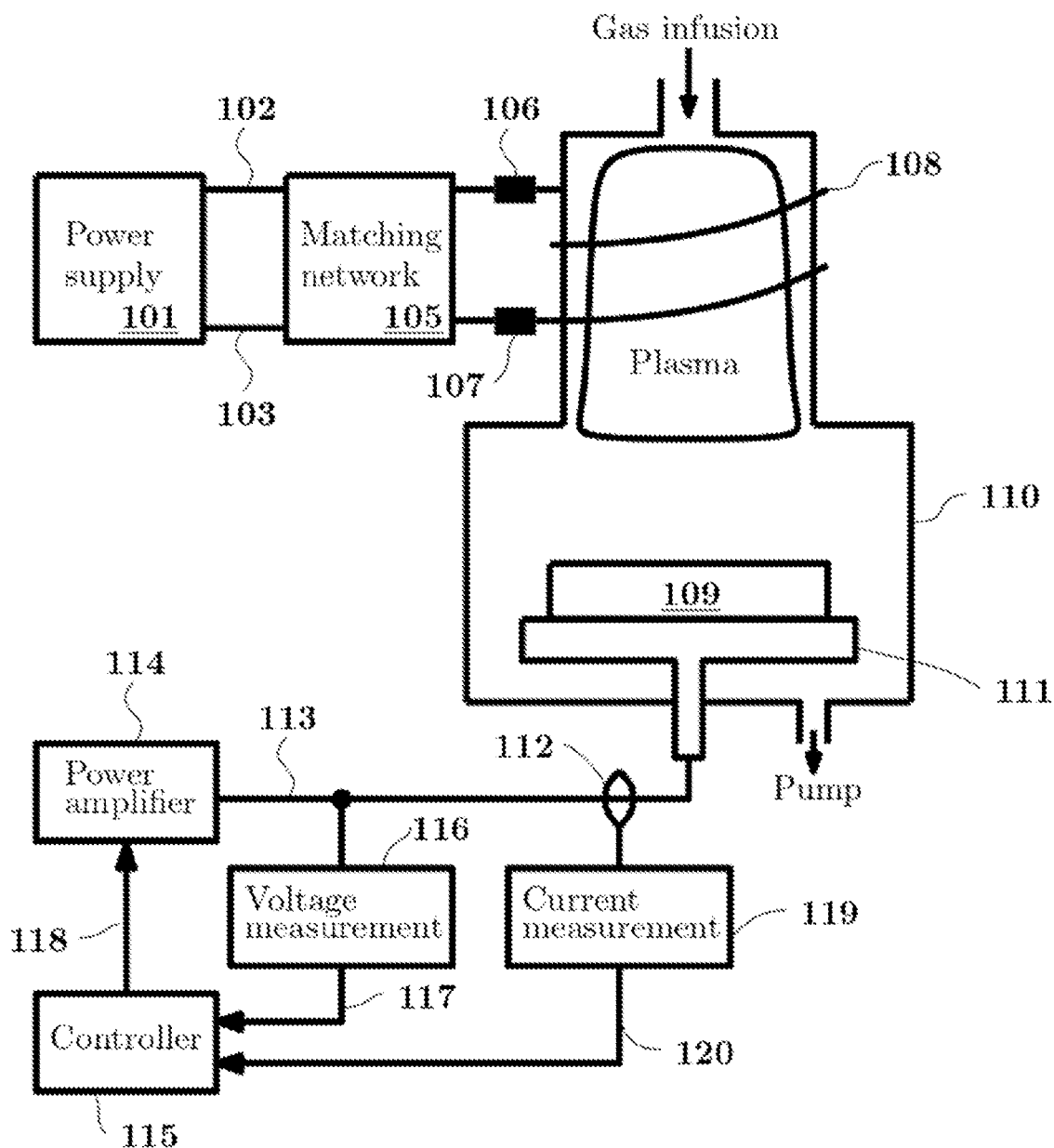
FIG. 1 illustrates the block diagram of an apparatus for plasma processing according to the present disclosure.

An apparatus for plasma processing a dielectric substrate, such as a semiconductor substrate, is shown in FIG. 1. Gas is infused to the reactor 110. The plasma is ignited in the reactor 110 with an external power supply 101, which is coupled with the gas by a matching network 105 and a coil 108 outside the chamber. The power supply is connected to the matching network 105 and the matching network is connected to the coil 108. The power supply 101 can be any suitable power source including radio-frequency (RF), microwave-frequency (MF) and pulsed dc power sources. Although the plasma source as shown in FIG. 1 is inductively coupled, it can be of any other variety, such as capacitively coupled plasma source and helicon type plasma source.

The apparatus of FIG. 1 can be used for plasma etching or deposition. Therefore, a dielectric substrate material 109 is placed on the table 111 inside the reactor 110. The pressure in the reactor is kept low (i.e. below atmospheric pressure) by a (vacuum) pump depicted in FIG. 1. A power amplifier 114 is connected to the table 111 through electrical connection 113.

A voltage measurement unit 116 can be connected to the power amplifier 114, measuring the output voltage of the amplifier. The voltage measurement unit 116 is coupled to controller 115 through (data) connection 117 for sending measured results to the controller 115.

A current measurement unit 119 can be provided to measure the output current of the power amplifier 114, e.g. through an interface 112 connected to electrical connection 113 and/or table 111. The current measurement unit 119 is coupled to controller 115 through (data) connection 120 for sending measured results to the controller 115.

The controller 115 implements an automatic control algorithm according to the present disclosure, which is based on the measured voltage and/or current values. The controller 115 is coupled to the power amplifier 114 through (data) connection 118 for sending control signals to the power amplifier 114 to adjust the output (voltage) waveform. The automatic control algorithm is configured to control ion energy in order to obtain a narrowest IED. Advantageously, the control algorithm is implemented as a real-time control system with a voltage and/or current feedback.

Figure 2:
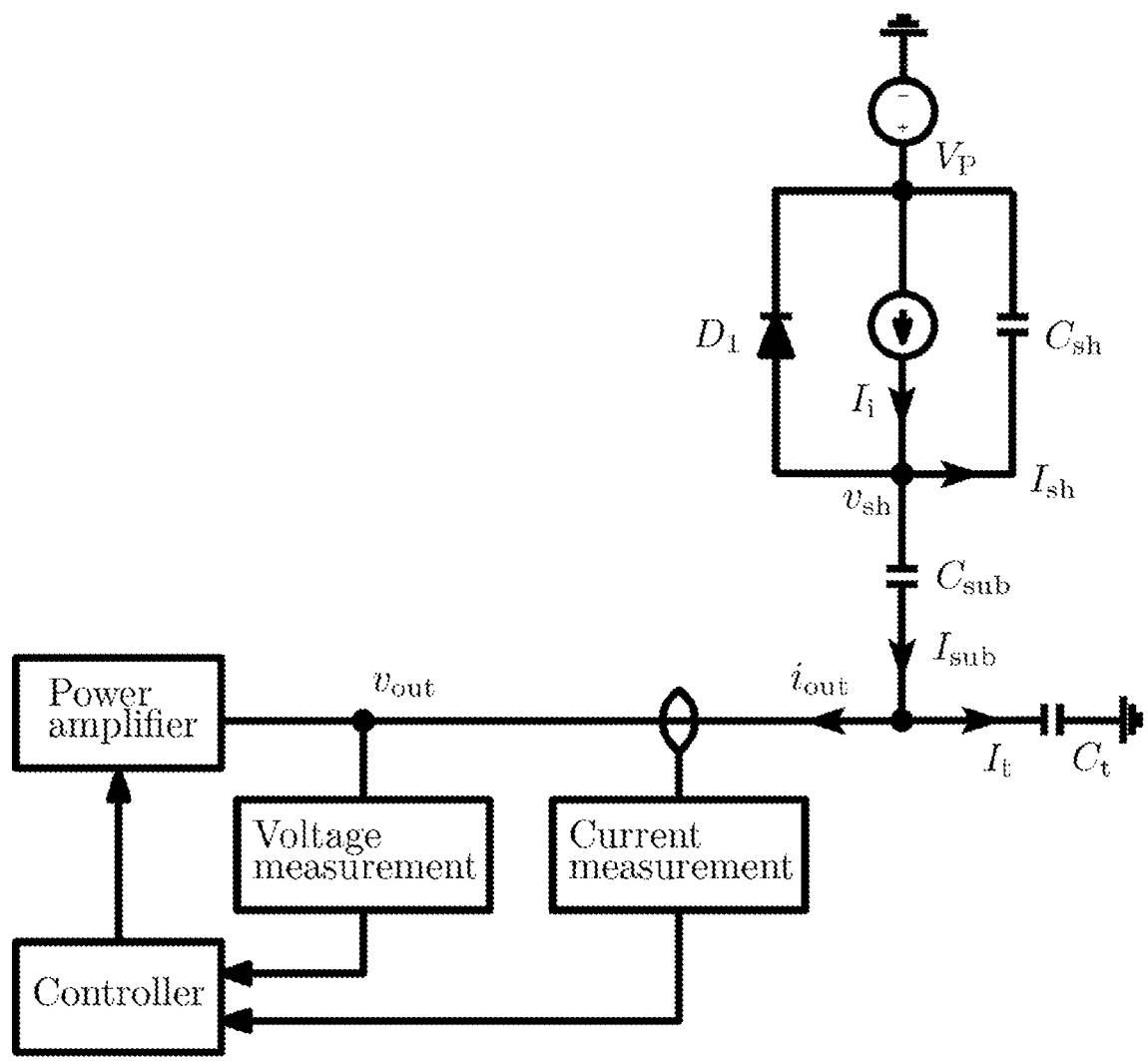
FIG. 2 represents a simplified electric model of the system of FIG. 1.

A basic equivalent electric model of the system of FIG. 1 is depicted in FIG. 2. During etching or deposition phase, the plasma can be assumed to be a constant voltage source $V_p$. An ion sheath is formed between the plasma and the surface of the material. The ion sheath is equivalent to a dc current source $I_I$ in parallel with a sheath capacitance $C_{sh}$ and a diode $D_1$. The substrate is equivalent to a capacitor $C_{sub}$. For a conductive substrate, $C_{sub}$ is infinitely large, which can be treated as an ideal wire. For a dielectric substrate, $C_{sub}$ has a finite value. There are parasitic capacitances between the table and other components, including the plasma and the reactor wall, which is defined by the table capacitance $C_t$. The table is conductive and connected to the output of the power amplifier.

For a conductive substrate, the output voltage $V_{out}$ is a constant dc value. The sheath voltage V sh is then defined by $V_{sh}=V_{out}$. The voltage and current measurement unit are used to monitor the dc value. $V_{out}$ is regulated by the feedback controller.

Figure 3:
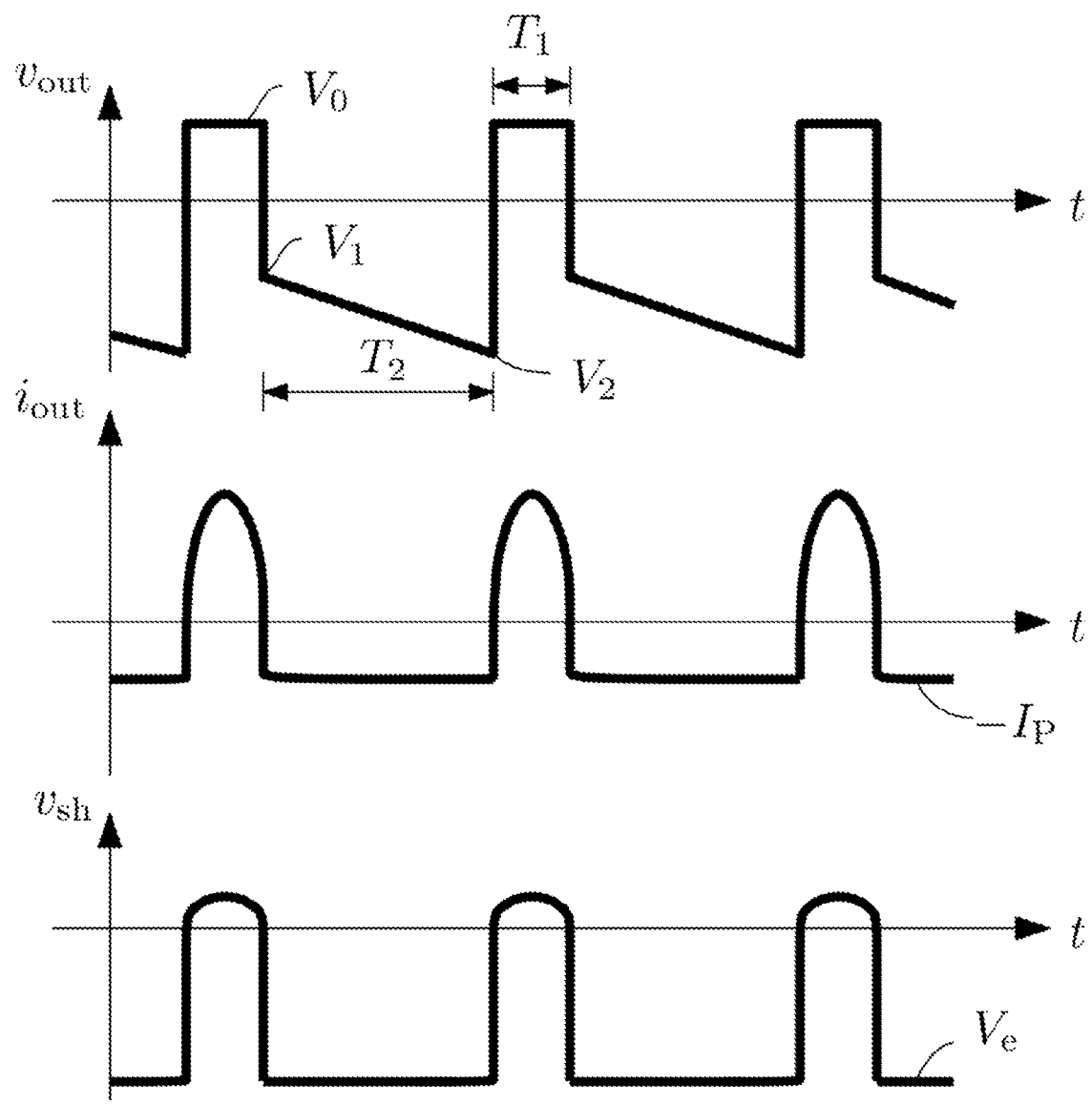
FIG. 3 depicts a typical waveform of the output voltage, the output current and the substrate voltage potential.

As depicted in FIG. 3, for a dielectric substrate, the waveform of $V_{out}$ is of a tailored pulse-shape, which can be divided into 2 phases, including a discharge phase and an etching or deposition phase. The discharge phase consists of a positive pulse $V_0$ lasting for $T_1$, used to attract electrons and discharge the substrate periodically. $T_1$ should be as short as possible only if the substrate surface gets fully discharged. The etching or deposition phase consists of a negative slope defined by $V_1$, $V_2$ and $T_2$. A negative voltage $V_1$ is applied to the table after the substrate is fully discharged. The voltage potential V e on the substrate surface during etching or deposition is approximated by $$V_e \approx V_1 - V_0.$$

To compensate the ion accumulation on the substrate surface, a negative voltage slope should be applied to the table. The voltage slope is defined by 3 portions $V_1$, $V_2$ and $T_2$. The slope rate S is defined by $$S = \frac{V_2 - V_1}{T_2}.$$

In order to obtain a constant negative voltage on the substrate during etching or deposition phase, the voltage slope rate should be tuned to an exact value, which is equivalent to $$S = -\frac{I_i}{C_{sub}}.$$

However, in practice, $I_I$ and $C_{sub}$ are unknown. In the prior arts, it is tuned either by hand or by theoretical calculation. Both tuning methods result in a deviation with the optimal voltage slope. In addition, the hand-tuning method requires a lot of time and an additional retarding field energy analyzer or equivalent. Furthermore, the above theoretical calculation method is based on an over-simplified model and relies on the pre-measured substrate capacitance, which might vary in the process.

Figure 4:
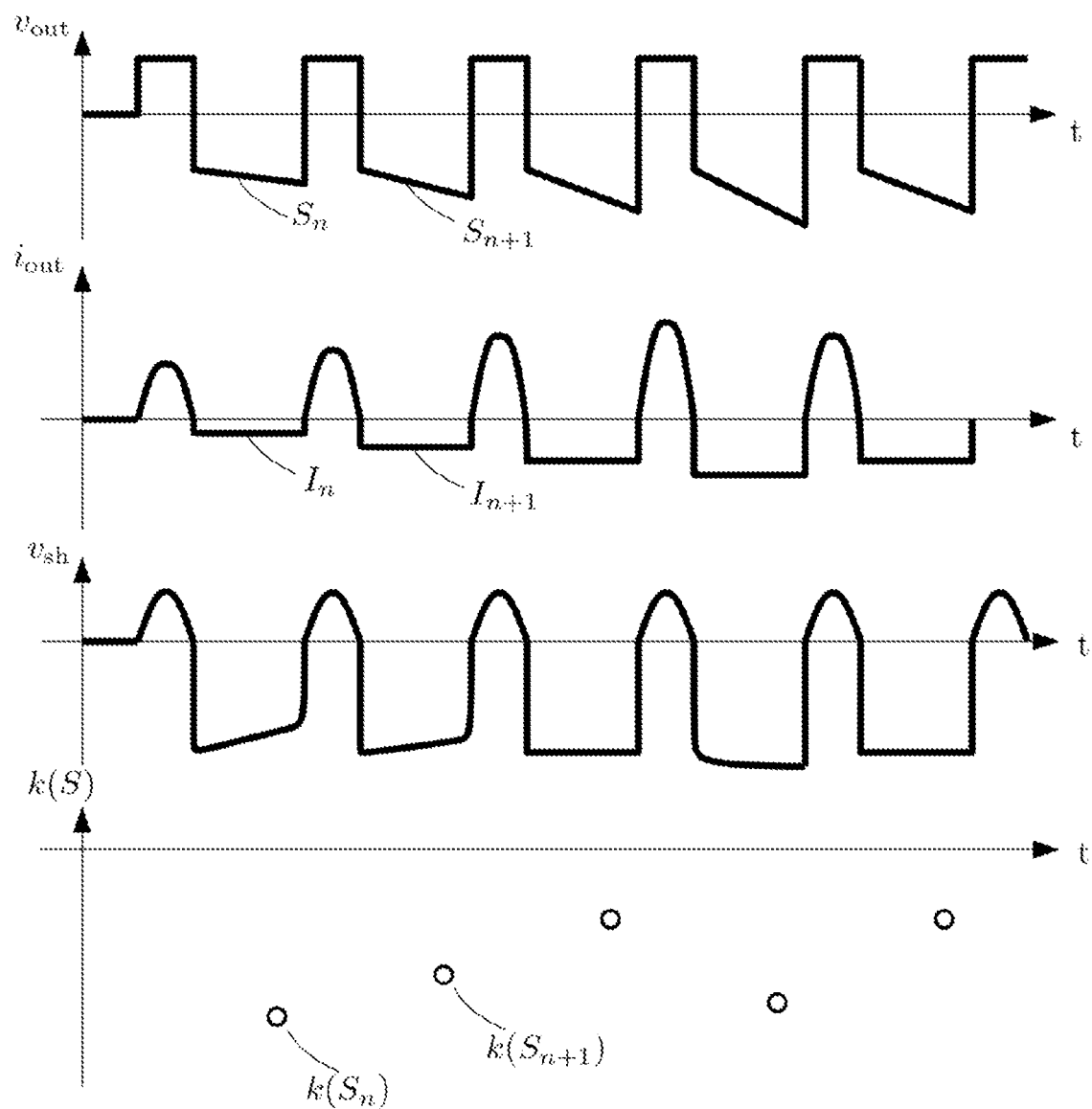
FIG. 4 illustrates a possible implementation of the auto-tuning method according to the present disclosure, comprising applying a sequence of first pulses having different voltage slopes.

Referring to FIG. 4, an algorithm to auto-tune the output voltage slope according to the present disclosure, works based only on output voltage and output current. Either one can be set, e.g. by controller 115 and the other one can be measured, e.g. by voltage measurement unit 116 and/or current measurement unit 119. The tuning algorithm according to the present disclosure can be implemented by the controller 115 in a fully automatic way and discards the need for any manual intervention or additional measurement (e.g. measurement of capacitance values).

During the etching or deposition phase, the output current is a negative dc value and equal to $-I_P$. The value of $I_P$ is given by $$I_P = -\left(\frac{C_{sh}C_{sub}}{C_{sh}+C_{sub}} + C_t\right)S + \frac{C_{sub}}{C_{sh}+C_{sub}}I_i.$$

If all the capacitances and the ion current are constant and independent of the sheath voltage, $I_P$ has a linear relation with the voltage slope rate S. However, in practice, the sheath capacitance $C_{sh}$ is dependent on the sheath voltage thus changing with the voltage slope rate S. $I_P$ can then be described as $$I_P = k(S)S + b(S),$$

Where $k(S)$ and $b(S)$ are a function of the voltage slope rate S and given by $$k(S) = -\left(\frac{C_{sh}C_{sub}}{C_{sh}+C_{sub}} + C_t\right)$$

and $$b(S) = \frac{C_{sub}}{C_{sh}+C_{sub}}I_i.$$

respectively. When the voltage slope rate S is tuned to the optimal value, with which the narrowest IED is obtained, $V_{sh}$ turns to be constant. $I_P$ is then given by $$I_P = -C_t S + I_i.$$

Since the capacitance $C_{sh}$, $C_{sub}$, $C_t$ are all positive, function $k(S)$ and $b(S)$ both reach their maximum values when the narrowest IED is achieved. When varying the voltage slope S, by finding the maximum value of $k(S)$ or $b(S)$, the IED can be tuned to be the narrowest.

In order to find the optimal voltage slope S, a series of voltage slopes $S_n$ (n=1, 2, 3 . . . ) are applied to the table in different switching cycles. The current measurement unit 119 then records the corresponding dc current values $I_n$ (n=1, 2, 3 . . . ) during etching or deposition phase. Alternatively, a series of output current values $I_n$ (n=1, 2, 3 . . . ) are set by the power amplifier 114, and the corresponding voltage slopes $S_n$ (n=1, 2, 3 . . . ) can be measured by voltage measurement unit 116.

The value of $k(S)$ or $b(S)$ can be calculated based on the real-time measurement results of the output voltage and current. $k(S)$ is approximated by $$k(S_n) = \frac{I_n - I_{n-1}}{S_n - S_{n-1}}.$$

$b(S)$ is approximated by $$b(S_n) = \frac{S_n I_{n-1} - S_{n-1} I_n}{S_n - S_{n-1}}.$$

The approximation is accurate if the step value of $S_n - S_{n-1}$ is sufficiently small. As depicted by FIG. 4, when $k(S_n)$ reaches its maximum value at $S_n = S_m$, the optimal output voltage slope is found to be $S_m$. The corresponding output current is equivalent to be $I_m$. The maximum value of $b(S_n)$ can also be used to find the optimal voltage slope.

The above method can be also used to calculate the unknown parameters. The table capacitance is found to be $$C_t = k(S_m).$$

The ion current is found to be $$I_i = b(S_m).$$

The substrate capacitance is found to be $$C_{sub} = -\frac{b(S_m)}{S_m}.$$

It should be noted that the power amplifier 114 can be any variety of suitable power amplifiers. In one embodiment, it can be a voltage-source amplifier, including a switched-mode voltage amplifier, a linear amplifier or any combination of them. In another embodiment, the power amplifier can be realized by a hybrid converter.

Figure 5:
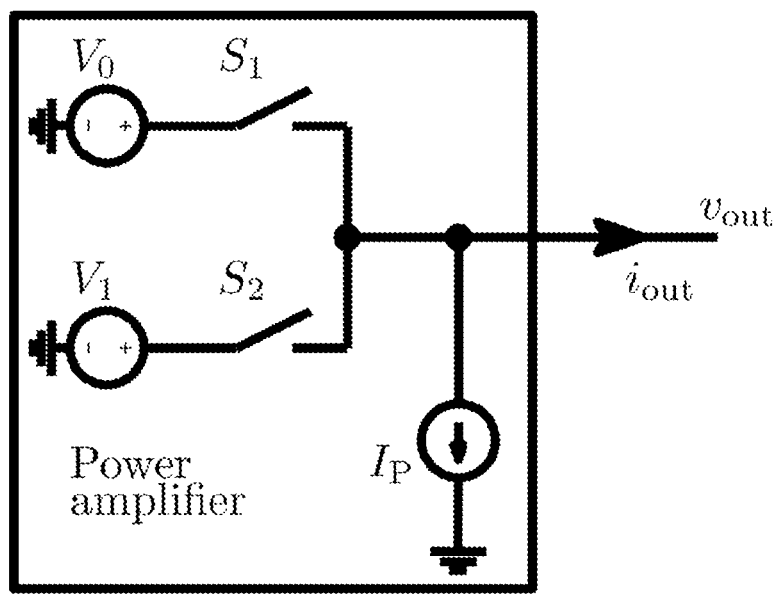
FIG. 5 represents a possible realization of the power supply for use in the apparatus of FIG. 1.

As depicted in FIG. 5, the hybrid converter comprises two adjustable dc voltage-source amplifiers $V_0$ and $V_1$, two switches $S_1$ and $S_2$ and an adjustable dc current-source amplifier $I_p$. The positive pulse $V_0$ can be obtained by turning on $S_1$. After the discharge phase, by turning off $S_1$ and turning on $S_2$ synchronously the output voltage $v_{out}$ turns to be $V_1$. By turning off $S_2$, a negative voltage slope is obtained since the current source is sinking current from the capacitive load. The output voltage slope rate is determined by the magnitude of the $I_p$. Such a hybrid converter is suitable for carrying out the tuning methods described herein. By varying the magnitude of the $I_p$, the maximum value of $k(S)$ or $b(S)$ can be found as described above, allowing to obtain the narrowest IED.

Methods of the present disclosure are not limited to find the maximum value of $k(S)$ or $b(S)$. In other embodiments, the structure of a reactor might be different, resulting in a different equivalent electric model. Since the sheath capacitance is virtually removed from the electric model when the narrowest IED is obtained, an exceptional behavior is introduced to the mathematic relations, such as an extremum, a singularity, etc. Such a behavior can be found by applying a dedicated test function, e.g. finding the maximum of coefficients $k(S)$ or $b(S)$, by varying the output voltage slope.

Figure 6:
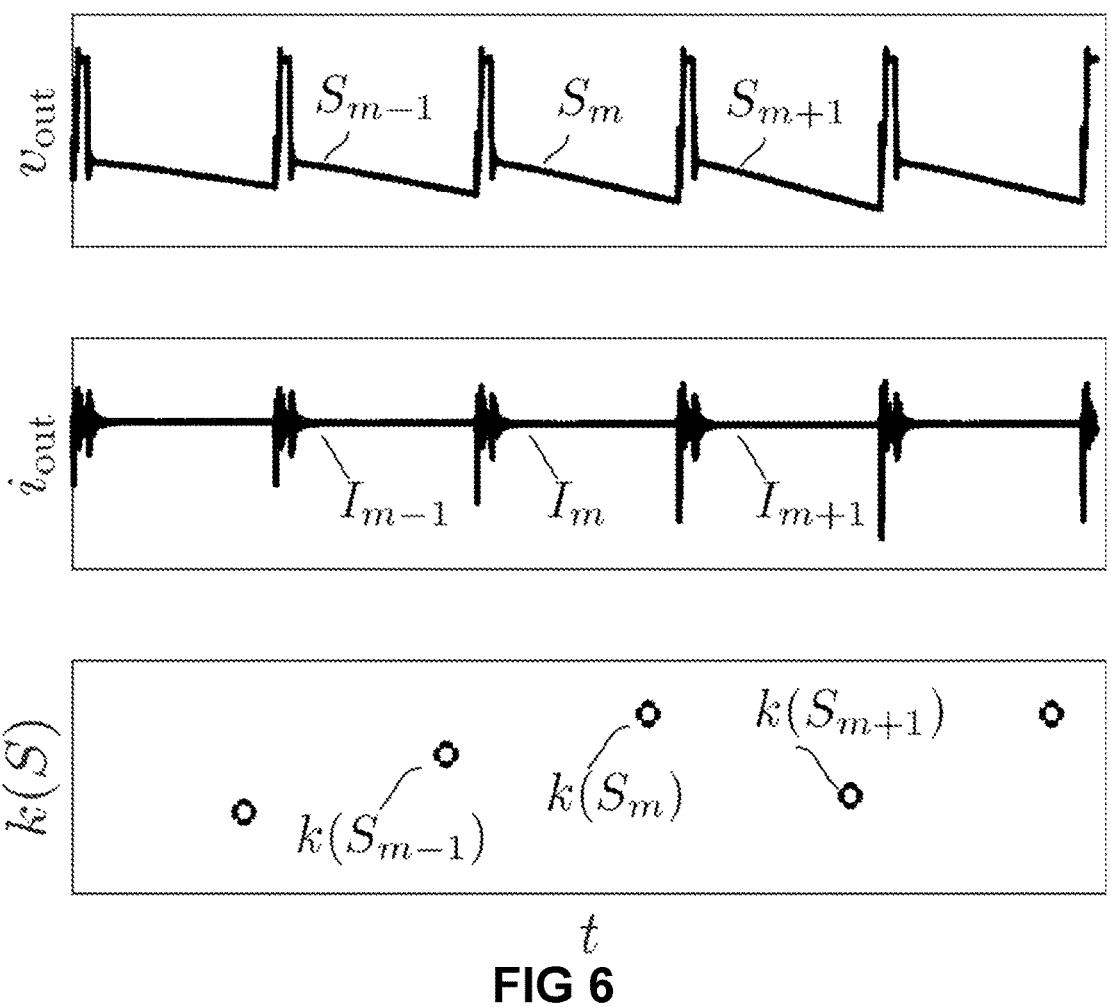
FIG. 6 shows graphs of output voltage output current and calculated coefficient values for an experimental setup of the method of the present disclosure.
Figure 7:
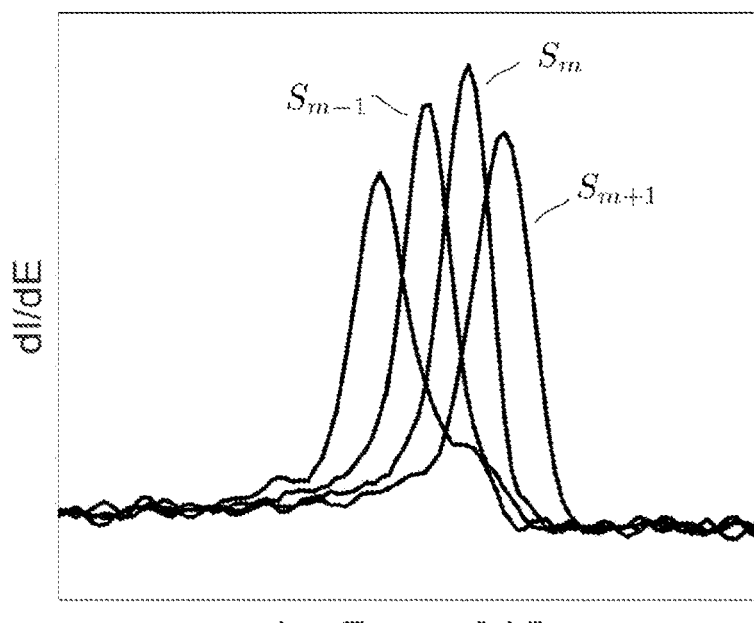
FIG. 7 shows the measured ion energy distribution corresponding to different voltage slopes of FIG. 6.

Referring to FIG. 6, the above auto-tuning method was implemented in an experiment. By varying the voltage slope $S_{m-1}$, $S_m$, $S_{m+1}$ of consecutive pulses and measuring corresponding output current $I_{m-1}$, $I_m$, $I_{m+1}$, the coefficient $k(S_{m-1})$, $k(S_m)$, $k(S_{m+1})$ could be determined and a maximum $k(S)$ was found to be $k(S_m)$. In FIG. 6, the dc current was changed in small steps and therefore the voltage slope difference between consecutive pulses is very small and hard to recognize from the figure. Therefore, the optimum voltage slope is $S_m$. The ion energy distribution was measured for the different voltage slopes, as depicted in FIG. 7. The IED corresponding to $S_m$ effectively yielded the narrowest width, thereby proving the reliability of the method of the present disclosure.

The invention claimed is:

1. A method of determining an ion energy for plasma processing of a dielectric substrate, the method comprising:
   exposing the dielectric substrate to a plasma discharge,
   applying a pulsed voltage waveform generated by a power supply to the dielectric substrate,
   wherein the pulsed voltage waveform comprises a sequence of pulses, each pulse comprising a higher voltage interval and a lower voltage interval, wherein the lower voltage interval comprises a voltage slope,
   generating first pulses of the sequence having differing voltage slopes between one another and applying the first pulses to the dielectric substrate, for each one of the first pulses, determining the voltage slope and an output current corresponding to the voltage slope at an output of the power supply, for each one of the first pulses, determining at least one coefficient of a mathematical relation between the voltage slope and the corresponding output current based solely on the voltage slope and the output current determined for one or more of the first pulses, applying a test function to the at least one coefficient and selecting a voltage slope value corresponding to the at least one coefficient making the test function true, wherein the test function is true for the voltage slope value representing a narrowest ion energy distribution.

2. The method of claim 1, wherein the at least one coefficient is an expression consisting of: one or more mathematical operators, one or more values of the voltage slopes and one or more values of the output current.

3. The method of claim 1, wherein the at least one coefficient is representative of one or more capacitances of an interaction between the plasma discharge and the dielectric substrate, the at least one coefficient being resolved based solely on the voltage slope and output current determined for one or more of the first pulses.

4. The method of claim 1, wherein the first pulses have monotonically increasing voltage slopes.

5. The method of claim 1, comprising measuring, for each of the first pulses, at least one of: the respective voltage slope and the output current corresponding to the voltage slope.

6. The method of claim 1, wherein the test function is configured to determine an extremum of the at least one coefficient.

7. The method of claim 1, further comprising:
generating second pulses of the sequence, the second pulses having a voltage slope corresponding to the voltage slope value; and
performing plasma processing of the dielectric substrate, comprising applying the second pulses to the dielectric substrate.

8. The method of claim 1, wherein the plasma processing is selected from one or a combination of: plasma-assisted etching and plasma-assisted deposition.

9. The method of claim 1, wherein the mathematical relation is a polynomial function between the output current and the voltage slope.

10. The method of claim 9, wherein the polynomial function is a first degree polynomial $I_P=kS+b$, wherein $I_P$ represents output current, S represents voltage slope and wherein the at least one coefficient is at least one of k and b.

* * * * *